United States Patent
Ogo et al.

(10) Patent No.: US 12,119,252 B2
(45) Date of Patent: Oct. 15, 2024

(54) CEILING TRAVELING VEHICLE SYSTEM AND METHOD FOR DETECTING OBSTACLE

(71) Applicant: MURATA MACHINERY, LTD., Kyoto (JP)

(72) Inventors: Haruki Ogo, Inuyama (JP); Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 672 days.

(21) Appl. No.: 17/289,310

(22) PCT Filed: Sep. 13, 2019

(86) PCT No.: PCT/JP2019/036185
§ 371 (c)(1),
(2) Date: Apr. 28, 2021

(87) PCT Pub. No.: WO2020/090254
PCT Pub. Date: May 7, 2020

(65) Prior Publication Data
US 2022/0013392 A1   Jan. 13, 2022

(30) Foreign Application Priority Data
Oct. 29, 2018  (JP) ................. 2018-203023

(51) Int. Cl.
*H01L 21/677*     (2006.01)
*B61B 3/00*       (2006.01)
(Continued)

(52) U.S. Cl.
CPC .......... *H01L 21/67733* (2013.01); *B61B 3/00* (2013.01); *B65G 1/0457* (2013.01);
(Continued)

(58) Field of Classification Search
CPC ......... H01L 21/67733; H01L 21/67259; H01L 21/67706; B61B 3/00; B65G 1/0457;
(Continued)

(56) References Cited

U.S. PATENT DOCUMENTS 6,443,400 B2 * 9/2002 Murata ................. B61L 23/005
  246/1 C
9,758,308 B1 * 9/2017 Nishikawa ........ H01L 21/67727
(Continued)

FOREIGN PATENT DOCUMENTS

CN   109110361 A  *  1/2019  ........... B65G 1/0492
CN   109470357 A  *  3/2019  ................. G01J 1/10
(Continued)

OTHER PUBLICATIONS

Ali Ors, "RADAR, Camera, LiDAR and V2X for Autonomous Cars," May 24, 2017, NXP Semiconductors, https://www.nxp.com/company/blog/radar-camera-lidar-and-v2x-for-autonomous-cars:BL-RADAR-LIDAR-V2X-AUTONOMOUS-CARS, accessed Nov. 21, 2023 (Year: 2017).*

(Continued)

*Primary Examiner* — Gerald McClain
(74) *Attorney, Agent, or Firm* — Keating & Bennett, LLP

(57) ABSTRACT

A ceiling traveling vehicle includes a traveler to travel along a grid-shaped track, a main body coupled to the traveler and below the track, and a detector on a rear side of a center of the main body in a traveling direction of the traveler and below the main body to apply detection light forward in the traveling direction and downward and receive reflected light of the detection light to detect an obstacle.

9 Claims, 11 Drawing Sheets

(51) Int. Cl.
  *B65G 1/04*     (2006.01)
  *G05D 1/00*     (2006.01)
  *H01L 21/67*    (2006.01)

(52) U.S. Cl.
  CPC ......... *G05D 1/0238* (2013.01); *G05D 1/0289* (2013.01); *H01L 21/67259* (2013.01); *H01L 21/67706* (2013.01); *B65G 2201/0297* (2013.01)

(58) Field of Classification Search
  CPC .. G05D 1/0238; G05D 1/0289; Y10S 414/14; B66C 17/00; B66C 21/00
  See application file for complete search history.

(56) References Cited

U.S. PATENT DOCUMENTS

| | | | | |
|---|---|---|---|---|
| 2008/0128374 | A1* | 6/2008 | Kyutoku | B66C 13/04 |
| | | | | 212/276 |
| 2015/0332948 | A1* | 11/2015 | Ikeda | H01L 21/67736 |
| | | | | 700/230 |
| 2016/0031460 | A1* | 2/2016 | Izumi | B61B 3/02 |
| | | | | 104/88.01 |
| 2017/0018188 | A1 | 1/2017 | Ono et al. | |
| 2017/0183154 | A1* | 6/2017 | Kinugawa | G05D 1/0223 |
| 2022/0013389 | A1* | 1/2022 | Feng | G01S 7/4861 |
| 2022/0344188 | A1* | 10/2022 | Qin | B66C 13/16 |
| 2023/0058552 | A1* | 2/2023 | Zheng | H01L 21/6773 |
| 2023/0118995 | A1* | 4/2023 | Ito | H01L 21/67724 |
| | | | | 700/218 |

FOREIGN PATENT DOCUMENTS

| | | | | |
|---|---|---|---|---|
| JP | 61-132387 | U | 8/1986 | |
| JP | 61-254496 | A | 11/1986 | |
| JP | 2006298536 | A * | 11/2006 | |
| JP | 4352925 | B2 | 10/2009 | |
| JP | 5707833 | B2 | 4/2015 | |
| JP | 2019049447 | A * | 3/2019 | ............... G01J 1/10 |
| JP | 7006050 | B2 * | 1/2022 | ............... G01J 1/10 |

OTHER PUBLICATIONS

Official Communication issued in corresponding Taiwanese Patent Application No. 108138761, mailed on Feb. 8, 2023.

Official Communication issued in corresponding Chinese Patent Application No. 201980071206.4, mailed on Aug. 26, 2023.

Official Communication issued in International Patent Application No. PCT/JP2019/036185, mailed on Dec. 3, 2019.

* cited by examiner

CEILING TRAVELING VEHICLE SYSTEM AND METHOD FOR DETECTING OBSTACLE

BACKGROUND OF THE INVENTION

1. Field of the Invention

The present invention relates to a ceiling traveling vehicle, a ceiling traveling vehicle system, and a method for detecting an obstacle.

2. Description of the Related Art

In semiconductor manufacturing factories or the like, a ceiling traveling vehicle system conveying articles such as front opening unified pods (FOUPs) housing semiconductor wafers or reticle pods housing reticles by ceiling traveling vehicles is being used, for example. In this ceiling traveling vehicle system, an optical obstacle sensor is provided in a ceiling traveling vehicle, for example, and when an obstacle is detected, the traveling of the ceiling traveling vehicle is stopped (refer to Japanese Patent No. 5707833). In the ceiling traveling vehicle in Japanese Patent No. 5707833, the obstacle sensor (a detector) is placed on the front side of the ceiling traveling vehicle in a traveling direction, detection light such as laser light is applied to be inclined downward with respect to the horizontal direction from the obstacle sensor, and reflected light reflected on the obstacle is received, whereby this detection light is prevented from entering an obstacle sensor of a ceiling traveling vehicle traveling side by side with the former ceiling traveling vehicle or passing it while detecting the obstacle in front in the traveling direction.

SUMMARY OF THE INVENTION

The ceiling traveling vehicle in Japanese Patent No. 5707833, even in a case in which there is another ceiling traveling vehicle in front in the traveling direction, detects the ceiling traveling vehicle in front by the obstacle sensor. That is, with the ceiling traveling vehicle system including the ceiling traveling vehicles in Japanese Patent No. 5707833, a method of preventing interference with the ceiling traveling vehicle in front using a detection result by the obstacle sensor is used. For such a method, a method of detecting an obstacle other than the ceiling traveling vehicles by the obstacle sensor while preventing interference between the ceiling traveling vehicles by means other than the obstacle sensor is demanded. In using this method, when the obstacle sensor in the ceiling traveling vehicle in Japanese Patent No. 5707833 is used, there is a problem in that the detection light may hit the ceiling traveling vehicle present in front in the traveling direction and be reflected thereby, and consequently, the other ceiling traveling vehicle in front is falsely detected as an obstacle.

Preferred embodiments of the present invention provide ceiling traveling vehicles, ceiling traveling vehicle systems, and methods for detecting an obstacle that can prevent another ceiling traveling vehicle from being falsely detected as an obstacle while surely detecting an obstacle as a hindrance to traveling.

A ceiling traveling vehicle according to an aspect of a preferred embodiment of the present invention includes a traveler to travel along a track, a main body coupled to the traveler and located below the track, and a detector on a rear side of a center of the main body in a traveling direction of the traveler and below the main body to apply detection light forward in the traveling direction and downward and to detect an obstacle by receiving reflected light of the detection light.

The main body may include an upper portion fixed to the traveler and a transfer apparatus below the upper portion to be rotatable about a rotation axis in a vertical direction, and the detector may be mounted on a support in the upper portion so as to be outside a rotational range of the transfer apparatus in a plan view. The detector may include two detectors at respective locations across the transfer apparatus on an imaginary line inclined by 45 degrees or substantially 45 degrees with respect to the traveling direction in a plan view, and a switch to switch to the detector on the rear side in the traveling direction among the two detectors may be included. Each of the two detectors may scan the detection light in a range of 90 degrees or substantially 90 degrees clockwise or counterclockwise in a plan view from the front in the traveling direction.

A ceiling traveling vehicle system according to an aspect of a preferred embodiment of the present invention is a ceiling traveling vehicle system including a track and a plurality of ceiling traveling vehicles traveling along the track, the ceiling traveling vehicles each being the ceiling traveling vehicle of the aspect described above.

The track may be a grid-shaped track including a plurality of first tracks provided along a first direction and a plurality of second tracks provided along a second direction perpendicular or substantially perpendicular to the first direction, the ceiling traveling vehicles may each be capable of traveling and shifting from one of the first tracks to one of the second tracks or shifting from one of the second tracks to one of the first tracks, and the detector may be capable of switching a detection range in accordance with a traveling direction in the grid-shaped track. The ceiling traveling vehicles may each include two detectors, and the detection range of one of the two detectors may be one range in both directions of the first direction and one range in both directions of the second direction, whereas the detection range of another of the two detectors may be another range in both directions of the first direction and another range in both directions of the second direction. The detector may scan the detection light to apply the detection light to the detection range.

A method for detecting an obstacle according to an aspect of a preferred embodiment of the present invention is a method for detecting an obstacle for a ceiling traveling vehicle, the ceiling traveling vehicle including a traveler to travel along a track and a main body coupled to the traveler and located below the track, the method including applying detection light from a rear side of a center of the main body in a traveling direction of the traveler and below the main body forward in the traveling direction and downward and detecting an obstacle by receiving reflected light of the detection light.

In the ceiling traveling vehicle and the method for detecting an obstacle according to the aspects of preferred embodiments of the present invention described above, the detection light is applied from the rear side of the center of the main body forward in the traveling direction and downward, and thus another ceiling traveling vehicle present in front on the track can be prevented from being falsely detected as an obstacle, for example, while surely detecting an obstacle as a hindrance to traveling. The detection light is directed downward, and thus an ascending object highly likely to be an obstacle can be detected early.

In the configuration in which the main body includes an upper portion fixed to the traveler and a transfer apparatus below the upper portion to be rotatable about a rotation axis in a vertical direction, and the detector is mounted on a support in the upper portion so as to be outside a rotational range of the transfer apparatus in a plan view, the support is mounted on the outside of the rotational range of the transfer apparatus, and thus the detector can be located at an appropriate position while preventing interference between the support and the transfer apparatus. In the configuration in which two detectors are located at respective positions across the transfer apparatus on an imaginary line inclined by 45 degrees or substantially 45 degrees with respect to the traveling direction in a plan view, and a switch to switch the detector on the rear side in the traveling direction among the two detectors is included, in a first direction and a second direction perpendicular or substantially perpendicular to each other, for example, when the ceiling traveling vehicle travels in any of both directions of the first direction and both directions of the second direction, either of the two sensors is used such that the detector can be located on the rear side in the traveling direction. In the configuration in which each of the two detectors scans the detection light in a range of 90 degrees or substantially 90 degrees clockwise or counterclockwise in a plan view from the front in the traveling direction, the two detectors each scan the detection light in a range of 90 degrees or substantially 90 degrees, and thus the detection light can be applied surely to both the front in the traveling direction and a direction perpendicular or substantially perpendicular the traveling direction.

In a ceiling traveling vehicle system according to an aspect of a preferred embodiment the present invention, the ceiling traveling vehicle is preferably used in a system in which the ceiling traveling vehicles travel along the track, and thus any of the ceiling traveling vehicles prevents false detection of an obstacle to prevent unnecessary stopping of the ceiling traveling vehicles, such that the operation efficiency of the system can be improved. Furthermore, when the ceiling traveling vehicles are close to each other, such as when the ceiling traveling vehicles travel along the track passing each other or when they travel side by side, the detection light from one ceiling traveling vehicle can be prevented from falsely entering the detector of the other ceiling traveling vehicle, and the ceiling conveyance vehicle can be prevented from receiving the detection light from the other ceiling traveling vehicle and falsely recognizing that an obstacle is present.

In the configuration in which the track is a grid-shaped track including a plurality of first tracks provided along a first direction and a plurality of second tracks provided along a second direction perpendicular or substantially perpendicular to the first direction, the ceiling traveling vehicles are each capable of traveling and shifting from one of the first tracks to one of the second tracks or shifting from one of the second tracks to one of the first tracks, and the detector is capable of switching a detection range in accordance with a traveling direction in the grid-shaped track, when the ceiling traveling vehicle travels along each of the first tracks or each of the second tracks, the detection range of the detector is switched in accordance with the traveling direction, and thus each ceiling traveling vehicle can detect an obstacle appropriately in accordance with the traveling direction. In the configuration in which the ceiling traveling vehicles each include two detectors, and the detection range of one of the two detectors is one range in both directions of the first direction and one range in both directions of the second direction, whereas the detection range of another of the two detectors is another range in both directions of the first direction and another range in both directions of the second direction, when any of both directions of the first direction or both directions of the second direction is set to the traveling direction, either of the two detectors is used. Consequently, detection of an obstacle can surely be performed. In the configuration in which the detector scans the detection light to apply the detection light to the detection range, the detection light is scanned such that the detection light can be applied to the detection range easily and surely.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8A is a diagram viewing the detection light from a lateral side; and FIG. 8B is a diagram viewed from an application side of the detection light.

FIG. 9A is a diagram illustrating a detection operation by the second detector; and FIG. 9B is a diagram illustrating a detection operation by the first detector.

FIG. 10A is a diagram of a state in which the ceiling traveling vehicles are separate from each other; and FIG. 10B is a diagram of a state in which the ceiling traveling vehicles are close to each other.

DETAILED DESCRIPTION OF THE PREFERRED EMBODIMENTS

Figure 1:
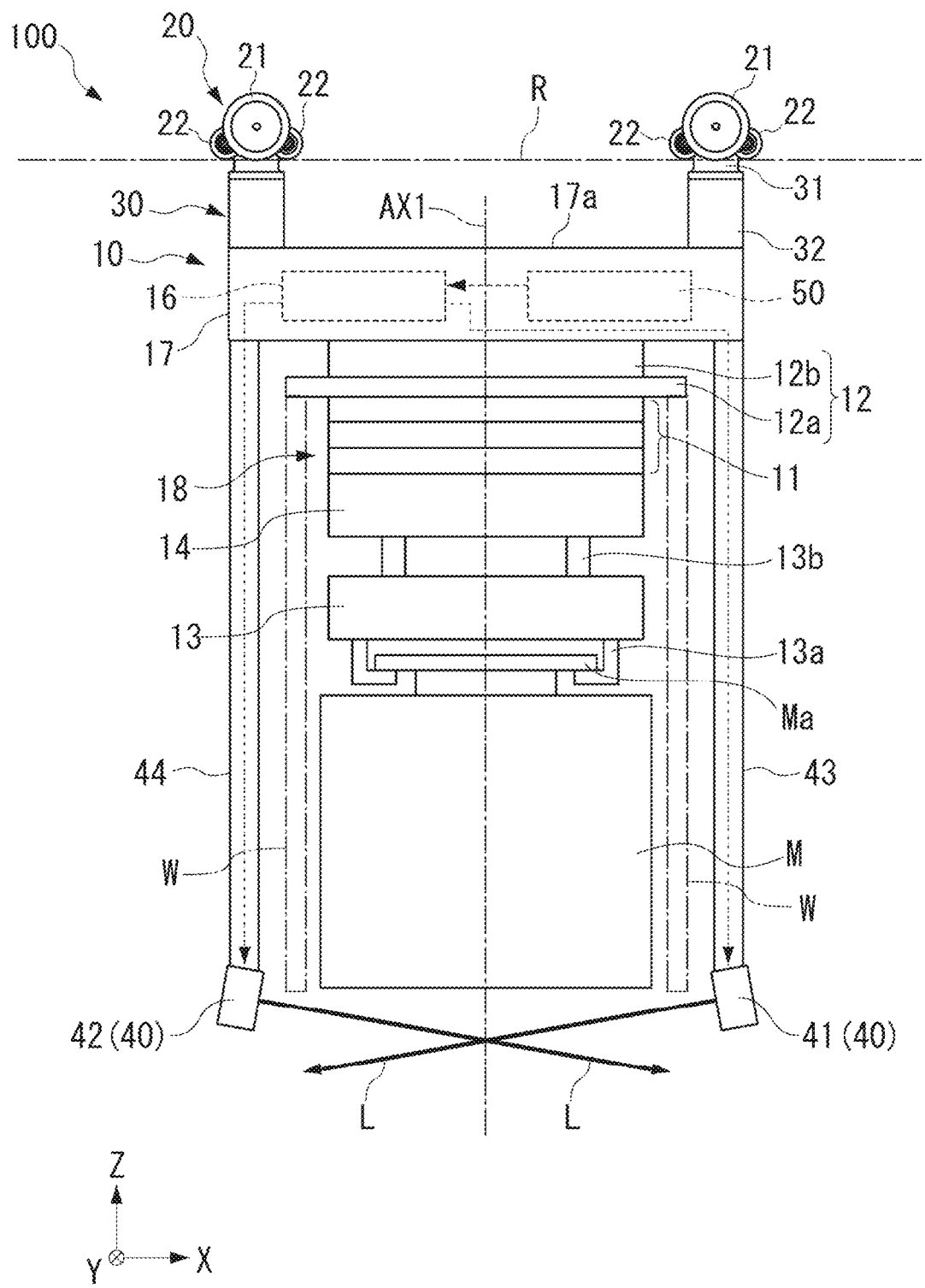
FIG. 1 is a side view illustrating an example of a ceiling traveling vehicle according to a present preferred embodiment of the present invention.

The following describes preferred embodiments of the present invention with reference to the drawings. However, the present invention is not limited to the aspects and preferred embodiments described below. To describe the preferred embodiments, the drawings are represented with a scale changed as appropriate such as in a partially enlarged or emphasized manner. In the drawings below, directions in the drawings are described using an XYZ coordinate system. In this XYZ coordinate system, a plane parallel to a horizontal plane is defined as an XY plane. On this XY plane, a linear direction, which is a traveling direction of a ceiling traveling vehicle 100, is denoted by an X direction for the sake of convenience, whereas a direction perpendicular or substantially perpendicular the X direction is denoted by a Y direction. The traveling direction of the ceiling traveling vehicle 100 can be changed from the state illustrated in the drawings below to another direction and the ceiling traveling vehicle 100 may travel in a curvilinear direction, for example. A direction perpendicular to the XY plane is denoted by a Z direction. Each of the X direction, the Y direction, and the Z direction is described with the direction indicated by the arrow in the drawings as a + (positive) direction and with the direction opposite to the direction indicated by the arrow as a − (negative) direction. A rotational direction about a Z axis is denoted by a θZ direction.

Figure 2:
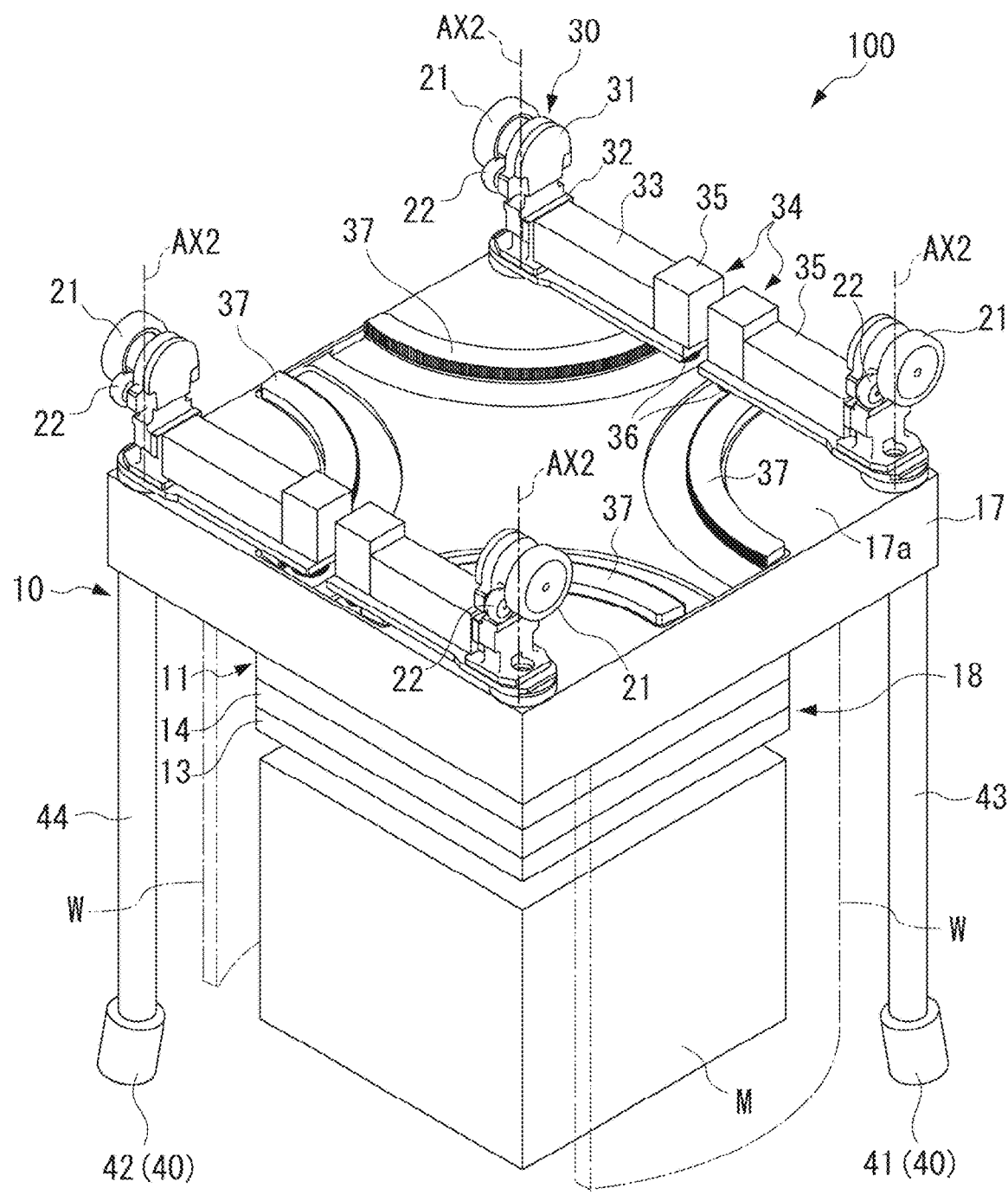
FIG. 2 is a perspective view of the ceiling traveling vehicle illustrated in FIG. 1.
Figure 3:
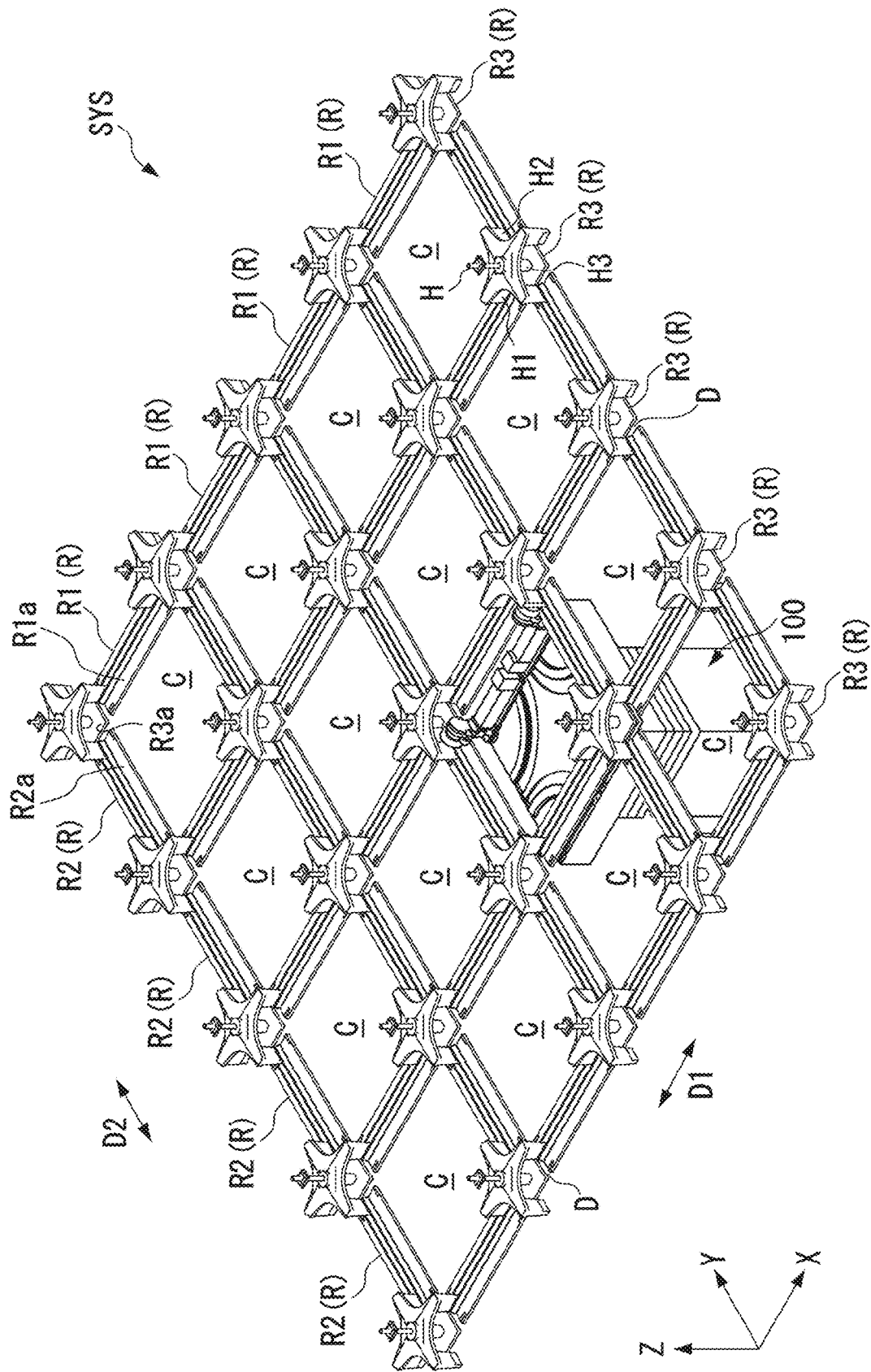
FIG. 3 is a perspective view illustrating an example of a ceiling traveling vehicle system according to a present preferred embodiment of the present invention.

FIG. 1 is a side view illustrating an example of a ceiling traveling vehicle 100 according to a present preferred embodiment. FIG. 2 is a perspective view of the ceiling traveling vehicle 100 illustrated in FIG. 1. FIG. 3 is a perspective view illustrating an example of a ceiling traveling vehicle system SYS according to the present preferred embodiment. As illustrated in FIG. 1 to FIG. 3, the ceiling traveling vehicle 100 moves along a grid-shaped track (a track) R of the ceiling traveling vehicle system SYS to convey an article M such as a front opening unified pod (FOUP) housing semiconductor wafers or a reticle pod housing reticles. The ceiling traveling vehicle 100 conveys the article M and may thus be referred to as a ceiling conveyance vehicle.

The ceiling traveling vehicle system SYS is a system to convey the article M by the ceiling traveling vehicle 100 in a clean room of a semiconductor manufacturing factory, for example. In the ceiling traveling vehicle system SYS, a plurality of ceiling traveling vehicles 100 may be used, for example. The ceiling traveling vehicles 100 convey the article M, thereby enabling high-density conveyance, and the conveyance efficiency of the article M can be improved.

The grid-shaped track R is one aspect of a track. The grid-shaped track R is laid on the ceiling of a building such as a clean room or near the ceiling. The grid-shaped track R includes a first track R1, a second track R2, and a partial track R3 (refer to FIG. 3). The first track R1 is provided along the X direction (a first direction D1). The second track R2 is provided along the Y direction (a second direction D2). In the present preferred embodiment, a plurality of first tracks R1 and a plurality of second tracks R2 are provided along directions perpendicular or substantially perpendicular each other but are provided so as not to directly cross each other. The partial track R3 is at a crossing portion between the first track R1 and the second track R2. The first tracks R1 and the second tracks R2 are provided along the directions perpendicular or substantially perpendicular each other such that the grid-shaped track R is in a state in which a plurality of cells C (sections) are adjacent to each other in a plan view.

The first track R1, the second track R2, and the partial track R3 are hung on the ceiling (not illustrated) with a hanger H (refer to FIG. 3). The hanger H includes a first portion H1 to hang the first track R1, a second portion H2 to hang the second track R2, and a third portion H3 to hang the partial track R3. First portions H1 and second portions H2 are each provided at two locations across the third portion H3.

The first track R1, the second track R2, and the partial track R3 include traveling surfaces R1a, R2a, and R3a, respectively, on which a traveling wheel 21 described below of the ceiling traveling vehicle 100 travels. A gap D is provided between the first track R1 and the partial track R3 and between the second track R2 and the partial track R3. The gap D is a portion over which a coupler 30 described below as a portion of the ceiling traveling vehicle 100 passes when the ceiling traveling vehicle 100 travels along the first track R1 to cross the second track R2 or when the ceiling traveling vehicle 100 travels along the second track R2 to cross the first track R1. Consequently, the gap D is provided in a width enabling the coupler 30 to pass thereover. The first track R1, the second track R2, and the partial track R3 are provided along the same or substantially the same horizontal plane. In the present preferred embodiment, the first track R1, the second track R2, and the partial track R3 are positioned such that the traveling surfaces R1a, R2a, and R3a on the same or substantially the same horizontal plane.

As illustrated in FIG. 1 and FIG. 2, the ceiling traveling vehicle 100 includes a main body 10, travelers 20, couplers 30, detectors 40, and a controller 50. The controller 50 collectively controls operations of the respective portions of the ceiling traveling vehicle 100. Although the controller 50 is provided in the main body 10, it may be provided outside the main body 10. The main body 10 is located below (on the −Z side of) the grid-shaped track R. The main body 10 preferably has a rectangular or substantially rectangular shape, for example, in a plan view. The main body 10 has dimensions housed in one cell C in the grid-shaped track R in a plan view. Thus, a space in which one ceiling traveling vehicle 100 passes another ceiling traveling vehicle 100 traveling along an adjacent first track R1 or second track R2 is ensured. The main body 10 includes an upper portion 17 and a transfer apparatus 18. The upper portion 17 is hung on the travelers 20 via the couplers 30. The upper portion 17 is rectangular or substantially rectangular in a plan view, for example, and has four corner portions in an upper surface 17a.

The transfer apparatus 18 is provided below the upper portion 17. The transfer apparatus 18 can rotate about a rotation axis AX1 in a vertical direction. The transfer apparatus 18 includes an article holder 13 to hold the article M, a hoisting-and-lowering driver 14 to hoist and lower the article holder 13 in the vertical direction, a lateral mover 11 moving the hoisting-and-lowering driver 14, and a rotator 12 holding the lateral mover 11. The article holder 13 grasps a flange Ma of the article M to hang and hold the article M. The article holder 13 includes a chuck including a horizontally movable hook 13a, for example, causes the hook 13a to enter below the flange Ma of the article M, and hoists the article holder 13 to hold the article M. The article holder 13 is connected to a hanger 13b such as a wire or a belt.

The hoisting-and-lowering driver 14 is a hoist, for example, which draws out the hanger 13b to lower the article holder 13, and winds up the hanger 13b to hoist the article holder 13. The hoisting-and-lowering driver 14 is controlled by the controller 50 to lower or hoist the article holder 13 at a certain speed. The hoisting-and-lowering driver 14 is controlled by the controller 50 to hold the article holder 13 at a target height. The lateral mover 11 includes a plurality of movable plates stacked in the Z direction, for example. The movable plates are movable in the Y direction. The hoisting-and-lowering driver 14 is mounted on a lowermost movable plate. The lateral mover 11 moves the movable plates by a drive apparatus (not illustrated) and can thus laterally move the hoisting-and-lowering driver 14 mounted on the lowermost movable plate and the article holder 13 with respect to the traveling direction. The lateral mover 11 moves the movable plates by the drive apparatus (not illustrated) and can thus one-sidedly slidingly move the hoisting-and-lowering driver 14 mounted on the lowermost movable plate and the article holder 13 in one direction with respect to the traveling direction, that is, in one direction in a linear direction. The rotator 12 is mounted on a rotational driver 12b between the lateral mover 11 and the upper portion 17 to hold the lateral mover 11.

The rotator 12 is provided between the lateral mover 11 and the upper portion 17. The rotator 12 includes a rotating member 12a and the rotational driver 12b. The rotating member 12a is provided rotatably in a direction about the Z axis. The rotating member 12a supports the lateral mover 11. The rotational driver 12b, for which an electric motor or the like is used, rotates the rotating member 12a in a direction about the rotation axis AX1 as a perpendicular axis. The rotator 12 rotates the rotating member 12a via a driving force applied from the rotational driver 12b and can thus rotate the lateral mover 11 (the hoisting-and-lowering driver 14 and the article holder 13) in the direction about the rotation axis AX1.

The rotational driver 12b, for which an electric motor or the like may be used, rotates the rotator 12 about the rotation axis AX1. The rotational driver 12b can rotate the lateral mover 11 about the rotation axis AX1 together with the rotation of the rotator 12. When the lateral mover 11 is rotated about the rotation axis AX1 by the rotational driver 12b, the hoisting-and-lowering driver 14 and the article holder 13 mounted on a lower side of the lateral slider 11 integrally rotate about the rotation axis AX1.

Figure 6:
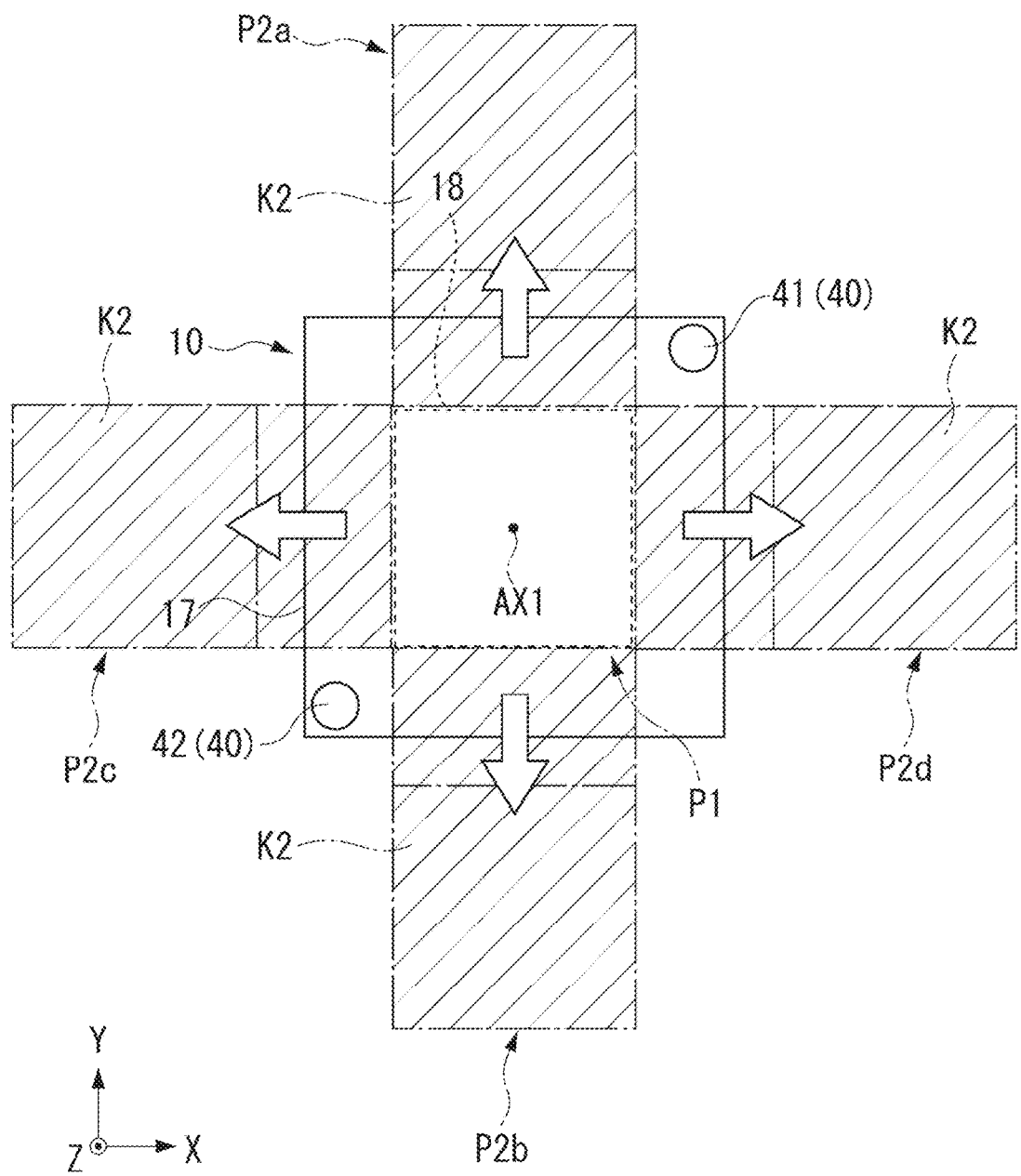
FIG. 6 is a diagram schematically illustrating a state laterally moved by a lateral mover.

FIG. 6 illustrates an example of rotational movement of the lateral mover 11 and the hoisting-and-lowering driver 14. As illustrated in FIG. 6, the rotational driver 12b can rotate the lateral mover 11 in a range of 270 degrees about the rotation axis AX1 from a state in which a direction of one-sided sliding movement of the lateral mover 11 is aligned with the X direction or the Y direction. In this case, the article holder 13 can be one-sidedly slidingly moved in any direction of the X direction and the Y direction from the main body 10 that is stationary on the grid-shaped track R.

The lateral mover 11 may be able to slidingly move the hoisting-and-lowering driver 14 and the article holder 13 in both directions in the linear direction. In this configuration, the rotational driver 12b may rotate the lateral mover 11 in a range of 90 degrees about the rotation axis AX1 from the state in which the direction of the sliding movement of the lateral mover 11 is aligned with the X direction or the Y direction. In this case, the article holder 13 can be slidingly moved in any direction of the X direction and the Y direction from the main body 10 stationary on the grid-shaped track R.

Furthermore, a second rotational driver (not illustrated) rotationally driving the hoisting-and-lowering driver 14 about a perpendicular axis with respect to the lateral mover 11 may be included. This second rotational driver is mounted on the lowermost movable plate in the lateral mover 11, for example. This second rotational driver, for which an electric motor or the like is used, rotates the hoisting-and-lowering driver 14 (the article holder 13) at least in a range of 180 degrees about the perpendicular axis on the basis of the linear direction in which the one-sided sliding movement is performed by the lateral mover 11. The second rotational driver is driven such that a state in which the front side of the article M is directed to the +X direction is rotated by 180 degrees about the perpendicular axis, such that the front side of the article M can be directed to the −X direction (that is, the opposite direction), for example. The hoisting-and-lowering driver 14 (the article holder 13) is rotated by 90 degrees by the second rotational driver such that the state in which the front side of the article M is directed to the +X direction can be made to a state in which the front side of the article M is directed to the +Y direction or the −Y direction.

A traveler 20 includes the traveling wheel 21 and auxiliary wheels 22. Traveling wheels 21 are located at the four respective corner portions of the upper surface 17a of the upper portion 17 (the main body 10). Each of the traveling wheels 21 is mounted on a rotating shaft provided in the coupler 30. The rotating shaft is parallel or substantially parallel to the XY plane. Each of the traveling wheels 21 is rotationally driven by the driving force of a traveling driver 33 described below. Each of the traveling wheels 21 rolls on the traveling surfaces R1a, R2a, and R3a of the first track R1, the second track R2, and the partial track R3, respectively, in the grid-shaped track R to cause the ceiling traveling vehicle 100 to travel. Without being limited to rotationally driving all the four traveling wheels 21 by the driving force of the traveling driver 33, some of the four traveling wheels 21 may be rotationally driven.

The traveling wheel 21 is provided turnably in the θZ direction about a turning axis AX2. The traveling wheel 21 turns in the θZ direction by a steerer 34 described below and can consequently change the traveling direction of the ceiling traveling vehicle 100. The auxiliary wheels 22 are located with one each on the front and rear in the traveling direction of the traveling wheel 21. Each of the auxiliary wheels 22, like the traveling wheel 21, is rotatable about an axis of a rotation axis parallel or substantially parallel to the XY plane. A lower end of the auxiliary wheels 22 is higher than a lower end of the traveling wheel 21. Consequently, when the traveling wheel 21 is traveling on the traveling surfaces R1a, R2a, and R3a, the auxiliary wheels 22 are not in contact with the traveling surfaces R1a, R2a, and R3a. When the traveling wheel 21 passes over the gap D, the auxiliary wheels 22 come into contact with the traveling surfaces R1a, R2a, and R3a to prevent the traveling wheel 21 from falling. Without being limited to providing two auxiliary wheels for one traveling wheel 21, one auxiliary wheel 22 may be provided for one traveling wheel 21, or no auxiliary wheels 22 may be provided, for example.

As illustrated in FIG. 1 and FIG. 2, the ceiling traveling vehicle 100 may be provided with a cover W so as to surround the transfer apparatus 18 and the article M held by the transfer apparatus 18. The cover W has a tubular shape with a lower end open with a portion through which the movable plates of the lateral mover 11 protrude notched. The cover W, the upper end of which is mounted on the rotating member 12a of the rotator 12, rotates about an axis of the rotation axis AX1 along with the rotation of the rotating member 12a.

The couplers 30 couple the upper portion 17 of the main body 10 and the travelers 20 to each other. The couplers 30 are provided at the four respective corner portions of the upper surface 17a of the upper portion 17 (the main body 10). The main body 10 is put into a hung state by these couplers 30 below the grid-shaped track R. The coupler 30 includes a support 31 and a connector 32. The support 31 rotatably supports a rotation axis of the traveling wheel 21 and rotation axes of the auxiliary wheels 22. The support 31 holds a relative position among the traveling wheel 21 and the auxiliary wheels 22.

The connector 32 extends downward from the support 31 to be coupled to the upper surface 17a of the upper portion 17 and to hold the upper portion 17. The connector 32 includes a transmitter to transmit the driving force of the traveling driver 33 described below to the traveling wheel 21 therewithin. For this transmitter, a chain or a belt may be used, or a gear train may be used. The connector 32 is provided rotatably in the θZ direction about the turning axis AX2. This connector 32 rotates about the turning axis AX2 to enable the traveling wheel 21 to turn in the θZ direction.

The coupler 30 is provided with the traveling driver 33 and the steerer 34. The traveling driver 33 is mounted on the connector 32. The traveling driver 33 is a driving source to drive the traveling wheel 21, and an electric motor or the like is used therefor, for example. The four traveling wheels 21 are each driven by the traveling driver 33 to be the drive wheels. The four traveling wheels 21 are controlled by the controller 50 so as to have the same or substantially the same number of rotations.

The steerer 34 rotates the connector 32 of the coupler 30 about the turning axis AX2 to turn the traveling wheel 21 in the θZ direction. The traveling wheel 21 is turned in the θZ direction such that the traveling direction of the ceiling traveling vehicle 100 can be changed from the first direction D1 to the second direction D2 or from the second direction D2 to the first direction D1.

The steerer 34 includes a driving source 35, a pinion gear 36, and a rack 37. The driving source 35 is mounted on a side surface of the traveling driver 33 separate from the turning axis AX2. For the driving source 35, an electric motor or the like is used, for example. The pinion gear 36 is mounted on a lower surface side of the driving source 35 and is rotationally driven in the θZ direction through driving force generated by the driving source 35. The pinion gear 36 is circular in a plan view and includes a plurality of teeth in a circumferential direction on its perimeter. The rack 37 is fixed to the upper surface 17a of the upper portion 17. Racks 37 are provided at the four respective corner portions of the upper surface 17a of the upper portion 17 and are each provided in a fan shape about the turning axis AX2 of the traveling wheel 21. Each rack 37 includes a plurality of teeth meshing with the teeth of the pinion gear 36 in a circumferential direction on its perimeter.

The pinion gear 36 and the rack 37 are positioned to mesh with the mutual teeth. The pinion gear 36 rotates in the θZ direction such that the pinion gear 36 moves in a circumferential direction about the turning axis AX2 so as to follow the perimeter of the rack 37. With this movement of the pinion gear 36, the traveling driver 33 and the steerer 34 turn in the circumferential direction about the turning axis AX2 together with the pinion gear 36.

By the turning of the steerer 34, the traveling wheels and the auxiliary wheels 22 at the four respective corner portions of the upper surface 17a turn in a range of 90 degrees in the θZ direction about the turning axis AX2. The drive of the steerer 34 is controlled by the controller 50. The controller 50 may instruct to perform turning operations of the four traveling wheels 21 at the same time or instruct to perform them at different times. The traveling wheels 21 and the auxiliary wheels 22 are turned such that a state in which the traveling wheels 21 are in contact with one of the first track R1 and the second track R2 shifts to a state in which the traveling wheels 21 are in contact with the other. Thus, the traveling direction of the ceiling traveling vehicle 100 can be switched between the first direction D1 (the X direction) and the second direction D2 (the Y direction).

The detector 40 is an obstacle sensor. The detector 40 includes a first detector 41 and a second detector 42. The first detector 41 and the second detector 42 each apply detection light L forward in the traveling direction and downward and receive reflected light of the detection light L to detect an obstacle. The first detector 41 and the second detector 42 each include an applicator (not illustrated) to emit the detection light L and a light receiver (not illustrated) to receive the reflected light of the detection light L.

The first detector 41 and the second detector 42 are each provided on a rear side of a center of the main body 10 in a traveling direction of the traveler 20 and below the main body 10. When the cover W surrounding the transfer apparatus 18 is included, the first detector 41 and the second detector 42 are below this cover W. In the present preferred embodiment, the center of the main body 10 matches or substantially matches the position of the rotation axis AX1 of the transfer apparatus 18. Consequently, when the traveling direction of the traveler 20 is the −X direction (the left direction in FIG. 1), the first detector 41 on the rear side (the +X side) of the center of the main body 10 (the rotation axis AX1) in the traveling direction defines and functions as the detector 40. In this case, the second detector 42 on the front side (the −X side) of the center of the main body 10 (the rotation axis AX1) in the traveling direction does not define and function as the detector 40. When the traveling direction of the traveler 20 is the +X direction (the right direction in FIG. 1), the second detector 42 on the rear side (the −X side) of the center of the main body 10 (the rotation axis AX1) in the traveling direction defines and functions as the detector 40. In this case, the first detector 41 on the front side (the +X side) of the center of the main body 10 (the rotation axis AX1) in the traveling direction does not define and function as the detector 40. Details of the first detector 41 and the second detector 42 will be described below.

The first detector 41 and the second detector 42 are mounted on lower ends of supports 43 and 44, respectively. The supports 43 and 44 are provided in a rod shape and are provided at mutually facing corner portions in the upper portion 17 in a plan view. Each of the supports 43 and 44 is mounted on a lower surface of the upper portion 17 and extends downward. The supports 43 and are parallel or substantially parallel to an up-and-down direction (the Z direction) and in addition to being parallel or substantially parallel to the rotation axis AX1.

Figure 4:
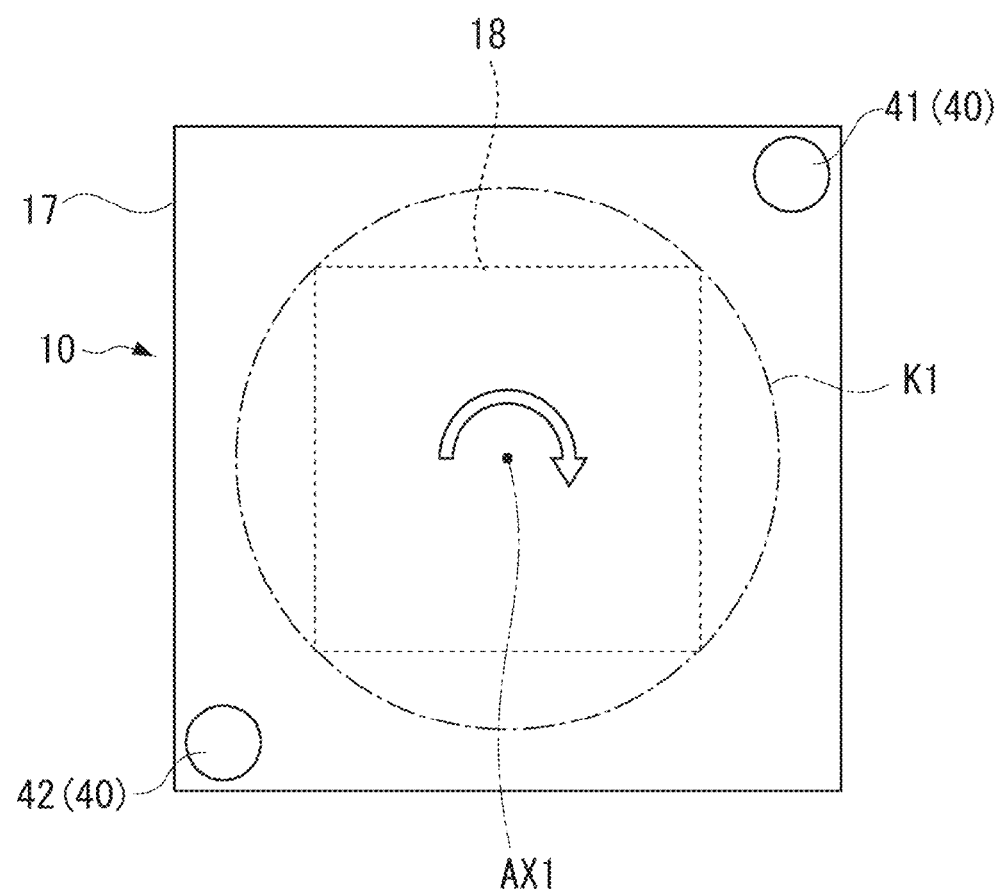
FIG. 4 is a diagram schematically illustrating a state in which the ceiling traveling vehicle is viewed from above.

FIG. 4 is a diagram schematically illustrating a state in which the main body 10 is viewed from above. As illustrated in FIG. 4, the first detector 41 and the second detector 42 are mounted on the supports 43 and 44, respectively, so as to be outside a rotational range K1 of the transfer apparatus 18 in a plan view. The rotational range K1 is a range of rotation about an axis of the rotation axis AX1 with lateral movement of the lateral mover 11 not performed in the transfer apparatus 18. The supports 43 and 44 are provided on the upper portion 17 so as to be outside the rotational range K1 (refer to FIG. 1 and FIG. 2). The supports 43 and 44 are located outside the rotational range K1 such that the first detector 41 and the second detector 42 can be located at appropriate positions while preventing interference between the supports 43 and 44 and the transfer apparatus 18. In FIG. 4, the representation of the cover W (refer to FIG. 1) is omitted. When the cover W is present around the transfer apparatus 18, the rotational range K1 includes this cover W, and the supports 43 and 44 are mounted on the upper portion 17 so as to be outside the rotational range K1 including the cover W.

Figure 5:
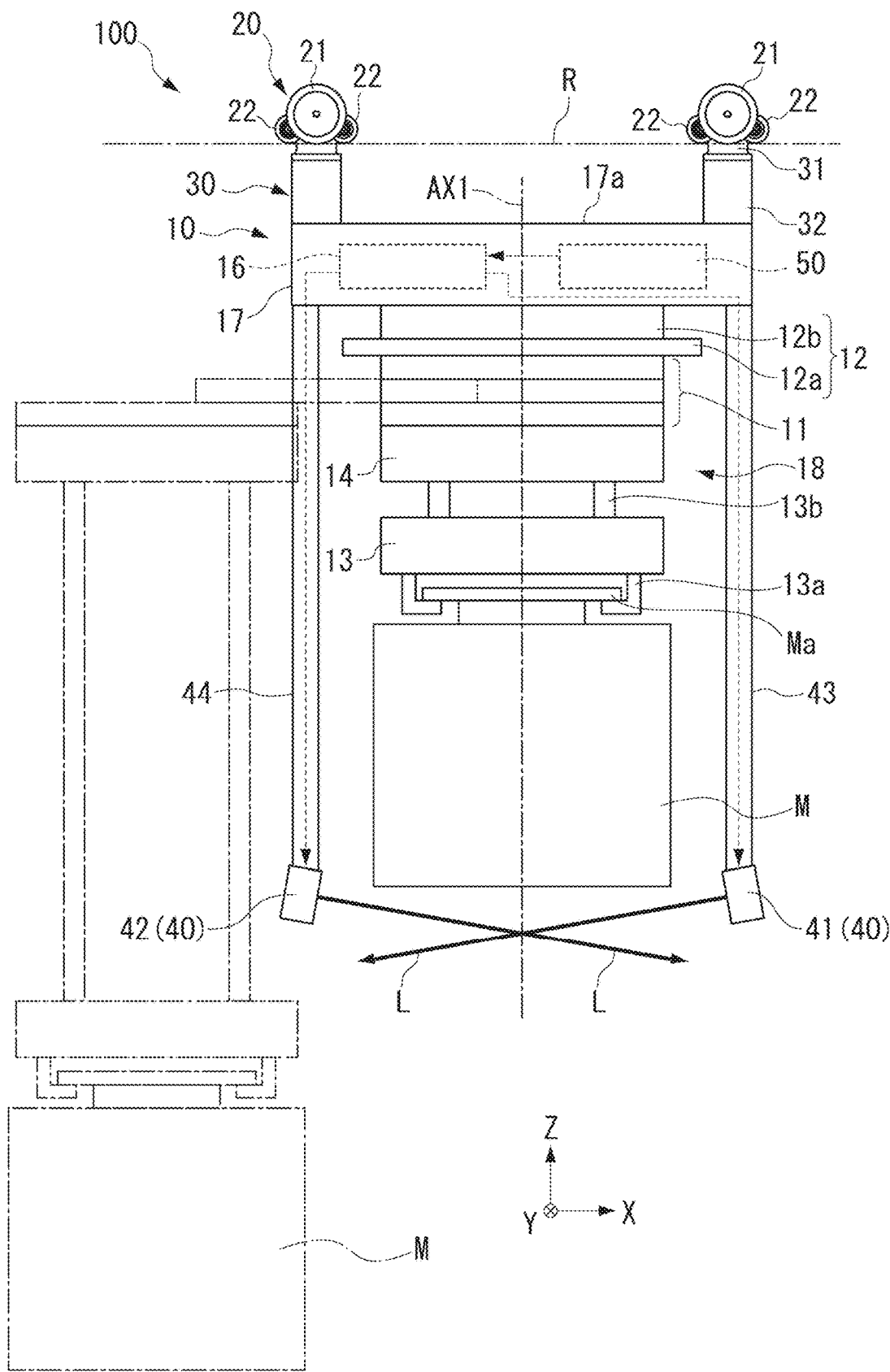
FIG. 5 is a side view illustrating an example of an operation of a transfer apparatus in the ceiling traveling vehicle.

FIG. 5 is a side view of an example of an operation of the transfer apparatus 18 in the ceiling traveling vehicle 100. As illustrated in FIG. 5, the transfer apparatus 18 laterally moves the lateral mover 11 to enable the hoisting-and-lowering driver 14 and the article holder 13 to protrude from below the lower unit 17. The direction in which they are caused to protrude is set by a rotational position of the rotating member 12a in the rotator 12. In the present preferred embodiment, the rod-shaped supports 43 and 44 are provided at the facing corner portions of the upper portion 17, and thus the rotational position of the rotating member 12a is set so as to prevent interference with the supports 43 and 44 when the lateral mover 11 is laterally moved.

FIG. 6 is a diagram schematically illustrating a state in which the hoisting-and-lowering driver 14 and the article holder 13 are laterally moved by the lateral mover 11. As illustrated in FIG. 6, the transfer apparatus 18 drives the lateral mover 11 to enable the hoisting-and-lowering driver 14 and the article holder 13 to protrude from a housing position P1 below the upper portion 17 to protruding positions P2a, P2b, P2c, and P2d. The protruding position P2a is a protruding position when the rotator 12 is driven to laterally move the hoisting-and-lowering driver 14 and the article holder 13 in the +Y direction by the lateral mover 11. Similarly, the protruding position P2b is a protruding position when the hoisting-and-lowering driver 14 and the article holder 13 are laterally moved in the −Y direction by the lateral mover 11. The protruding position P2c is a protruding position when the hoisting-and-lowering driver 14 and the article holder 13 are laterally moved in the −X direction by the lateral mover 11. The protruding position P2d is a protruding position when the hoisting-and-lowering driver 14 and the article holder 13 are laterally moved in the +X direction by the lateral mover 11. Thus, although the lateral mover 11 laterally moves the hoisting-and-lowering driver 14 and the article holder 13 in one direction, the rotator 12 is driven to set the rotational position of the rotating member 12a at 90-degree intervals to enable the hoisting-and-lowering driver 14 and the article holder 13 to be laterally moved in four directions, or the +X direction (the first direction D1), the +Y direction (the second direction D2), the −X direction (the first direction D1), and the −Y direction (the second direction D2).

As illustrated in FIG. 6, an area in which the hoisting-and-lowering driver 14 and the article holder 13 are caused to protrude from the housing position P1 to the protruding positions P2a, P2b, P2c, and P2d by the lateral mover 11 is indicated by a movement range K2. The first detector 41 and the second detector 42 are located at positions that do not overlap with the movement range K2 in a plan view. With this placement, the first detector and the second detector 42 can be located at appropriate positions while preventing interference between the supports 43 and 44 and the lateral mover 11 (the hoisting-and-lowering driver 14 and the article holder 13).

Figure 7:
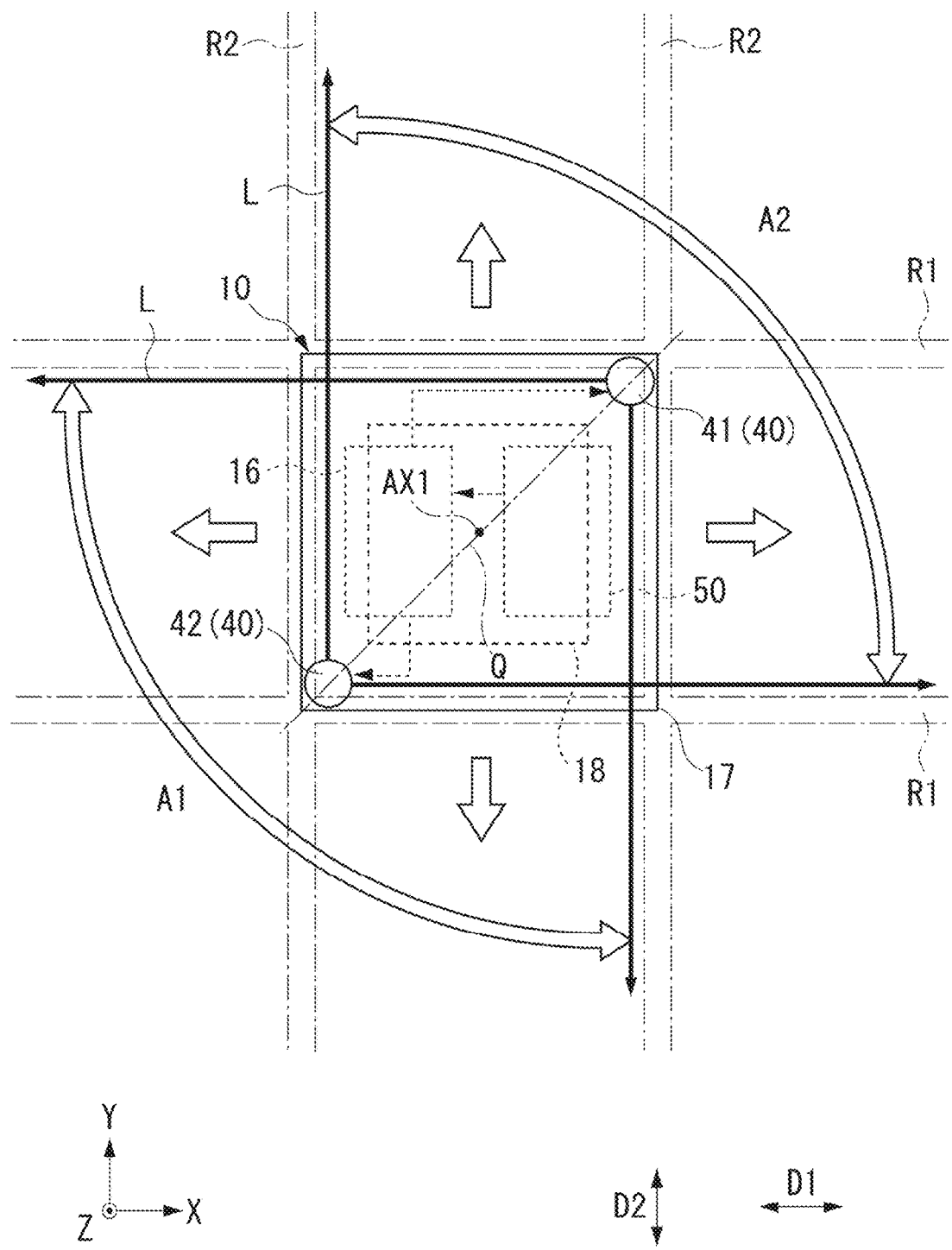
FIG. 7 is a diagram illustrating detection ranges of a first detector and a second detector.

FIG. 7 is a diagram illustrating detection ranges of the first detector 41 and the second detector 42 and illustrates how the detection light L is scanned. In FIG. 7, a case in which the first detector 41 is located at a corner portion on the +X side and the +Y side, whereas the second detector 42 is located at a corner portion on the −X side and the −Y side with respect to a central portion of the main body 10 (the rotation axis AX1) is described as an example. The first detector 41 and the second detector 42 are provided at the mutually facing corner portions in the upper portion 17. That is, the first detector 41 and the second detector 42 are provided at two respective places across the transfer apparatus 18 on an imaginary line Q inclined by 45 degrees or substantially 45 degrees with respect to the traveling direction in a plan view.

The first detector 41 and the second detector 42 each scan the detection light L in a range of 90 degrees or substantially 90 degrees clockwise or counterclockwise in a plan view from the front in the traveling direction. As illustrated in FIG. 7, the first detector 41 scans the detection light L clockwise or counterclockwise in a range from the −X direction to the −Y direction. The second detector 42 scans the detection light L clockwise or counterclockwise in a range from the +X direction to the +Y direction. One of the first detector 41 and the second detector 42 on the rear side in the traveling direction of the traveler 20 applies and scans the detection light L. That is, when the traveling direction of the traveler 20 is the −X direction or the −Y direction, the first detector 41 is the detector 40 on the rear side in the traveling direction with respect to the central portion of the main body 10 for each case. When the traveling direction of the traveler 20 is the +X direction or the +Y direction, the second detector 42 is the detector 40 on the rear side in the traveling direction with respect to the central portion of the main body 10 for each case.

The detection range of the first detector 41 is a detection range A1, which includes the −X direction as one of both directions of the first direction D1 and the −Y direction as one of both directions of the second direction D2. The detection range of the second detector 42 is a detection range A2, which includes the +X direction as the other of both directions of the first direction D1 and the +Y direction as the other of both directions of the second direction D2. Thus, the detection range in four directions in which the traveler 20 can travel can be covered by the two detectors, or the first detector 41 and the second detector 42, and thus the number of the detector 40 for the four directions to be detected is small, and an increase in apparatus costs can be reduced.

The upper portion 17 of the main body 10 includes a switch 16 to switch between the first detector 41 and the second detector 42 of the detector 40. The switch 16 switches between the first detector 41 and the second detector 42 under control of the controller 50. The controller 50 acquires the traveling direction of the traveler 20 and outputs the acquired traveling direction to the switch 16 as appropriate. The switch 16 selects the first detector 41 or the second detector 42 on the rear side in the traveling direction out of the first detector 41 and the second detector 42 based on the traveling direction input from the controller 50.

When the traveling direction of the traveler 20 is the −X direction, the switch 16 performs switching such that application and scanning of the detection light L are performed by the first detector 41 on the rear side in the traveling direction. The first detector 41 scans the detection light L in the detection range A1 and can thus detect an obstacle in the −X direction as the traveling direction. The detection light L is scanned in the detection range A1 when the traveling direction is the −X direction, and thus the detection light L is also applied in the −Y direction. In this case, the controller 50 may perform control to exclude reflected light when the detection light L is applied in the −Y direction from a detection result. Consequently, an object present in a direction (the −Y direction) different from the traveling direction (the −X direction) can be prevented from being falsely recognized as an obstacle.

When the traveling direction of the traveler 20 is the −Y direction, like the case in which the traveling direction is the −X direction, the switch 16 performs switching such that application and scanning of the detection light L are performed by the first detector 41 on the rear side in the traveling direction. The detection light L is scanned in the detection range A1 when the traveling direction is the −Y direction, and thus the detection light L is also applied in the −X direction. In this case, the controller 50 may perform control to exclude reflected light when the detection light L is applied in the −X direction from a detection result. Consequently, an object present in a direction (the −X direction) different from the traveling direction (−Y direction) can be prevented from being falsely recognized as an obstacle.

When the traveling direction of the traveler 20 is the +X direction, the switch 16 performs switching such that application and scanning of the detection light L are performed by the second detector 42 on the rear side in the traveling direction. The second detector 42 scans the detection light L in the detection range A2 and can thus detect an obstacle in the +X direction as the traveling direction. The detection light L is scanned in the detection range A2 when the traveling direction is the +X direction, and thus the detection light L is also applied in the +Y direction. In this case, the controller 50 may perform control to exclude reflected light when the detection light L is applied in the +Y direction from a detection result. Consequently, an object present in a direction (the +Y direction) different from the traveling direction (+X direction) can be prevented from being falsely recognized as an obstacle.

When the traveling direction of the traveler 20 is the +Y direction, like the case in which the traveling direction is the +X direction, the switch 16 performs switching such that application and scanning of the detection light L are performed by the second detector 42 on the rear side in the traveling direction. The detection light L is scanned in the detection range A2 when the traveling direction is the +Y direction, and thus the detection light L is also applied to the +X direction. In this case, the controller 50 may perform control to exclude reflected light when the detection light L is applied in the +X direction from a detection result. Consequently, an object present in a direction (the +X direction) different from the traveling direction (+Y direction) can be prevented from being falsely recognized as an obstacle.

Figure 8A:
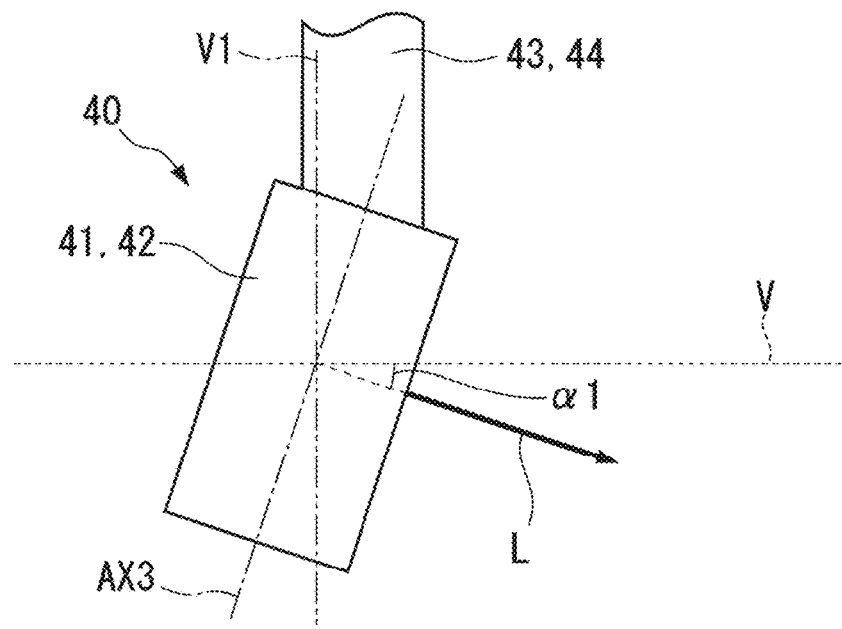
FIGS. 8A and 8B illustrate examples in which detection light is scanned.
Figure 8B:
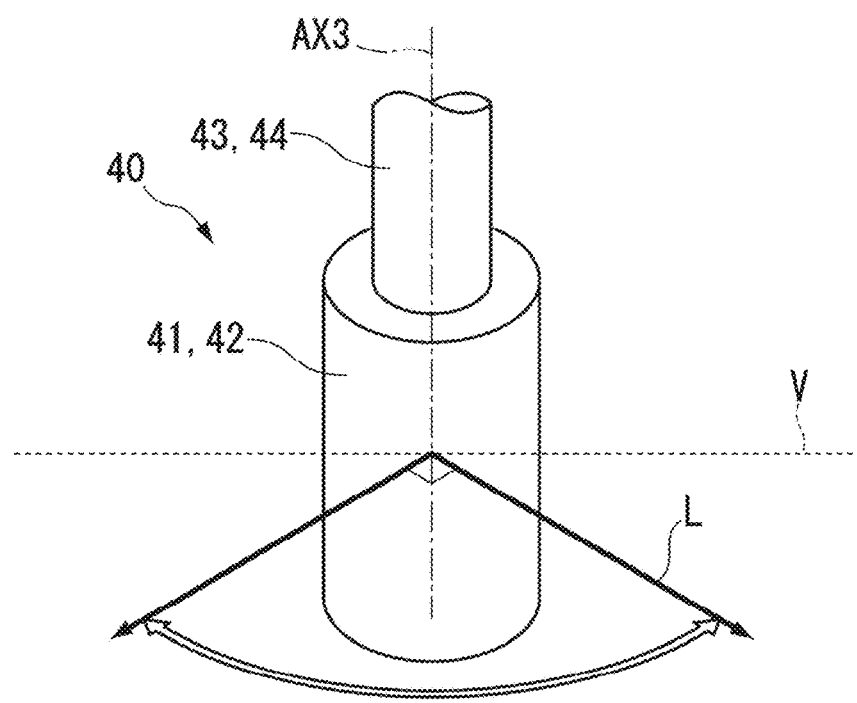

FIGS. 8A and 8B illustrate examples in which the detection light L is scanned by the first detector 41 and the second detector 42: FIG. 8A is a diagram when the detection light L is viewed from a lateral side; and FIG. 8B is a diagram when the detection light L is viewed from an application side. The first detector 41 and the second detector 42 each include a laser light source (not illustrated), for example, and emit laser light in the infrared region as the detection light L. As illustrated in FIG. 8A, the first detector 41 and the second detector 42 emit the detection light L inclined downward by a certain angle α1 with respect to a horizontal direction V. The first detector 41 and the second detector 42 each have the light receiver (not illustrated) receiving reflected light reflected by an object hit by the applied detection light L.

The first detector 41 and the second detector 42 scan the detection light L by rotating it in a direction about a scanning axis AX3. The scanning axis AX3 is inclined by the certain angle α1 with respect to a vertical axis V1 (the Z direction). The direction in which the scanning axis AX3 is inclined in a plan view is inclined by 45 degrees or substantially degrees with respect to the traveling direction (the first direction D1 or the second direction D2). The direction in which the scanning axis AX3 is inclined matches the direction of the imaginary line Q in FIG. 7 in a plan view. When the detection light L is scanned, it may be performed by rotating the light source (not illustrated) in the direction about the scanning axis AX3, for example. The configuration scanning the detection light L is not limited to the above, and any configuration can be used. The first detector 41 and the second detector 42 each transmit a value of the light receiver (not illustrated) (a detection result) to the controller 50. The controller 50 determines whether or not an obstacle is present based on an output value of the light receiver.

As illustrated in FIG. 8B, the detection light L is scanned about the scanning axis AX3 in a range of a total of 90 degrees with right and left ranges each up to 45 degrees about the direction in which the scanning axis AX3 is inclined. Consequently, the detection light L is prevented from being applied in the horizontal direction V. With this configuration, the detection light L is scanned with its downward direction maintained, and thus it can be prevented that the detection light L is applied in the horizontal direction V, and this detection light L is received by the detector 40 of another ceiling traveling vehicle 100 to falsely recognize that an obstacle is present, for example.

Figure 9A:
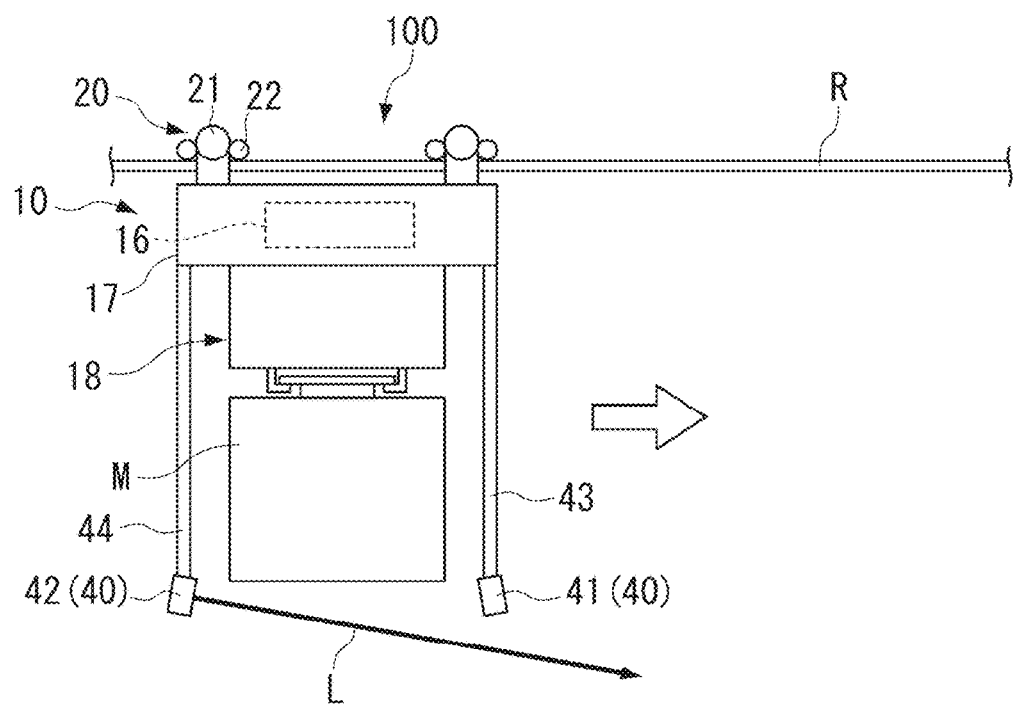
FIGS. 9A and 9B illustrate examples of operations of the first detector and the second detector.
Figure 9B:
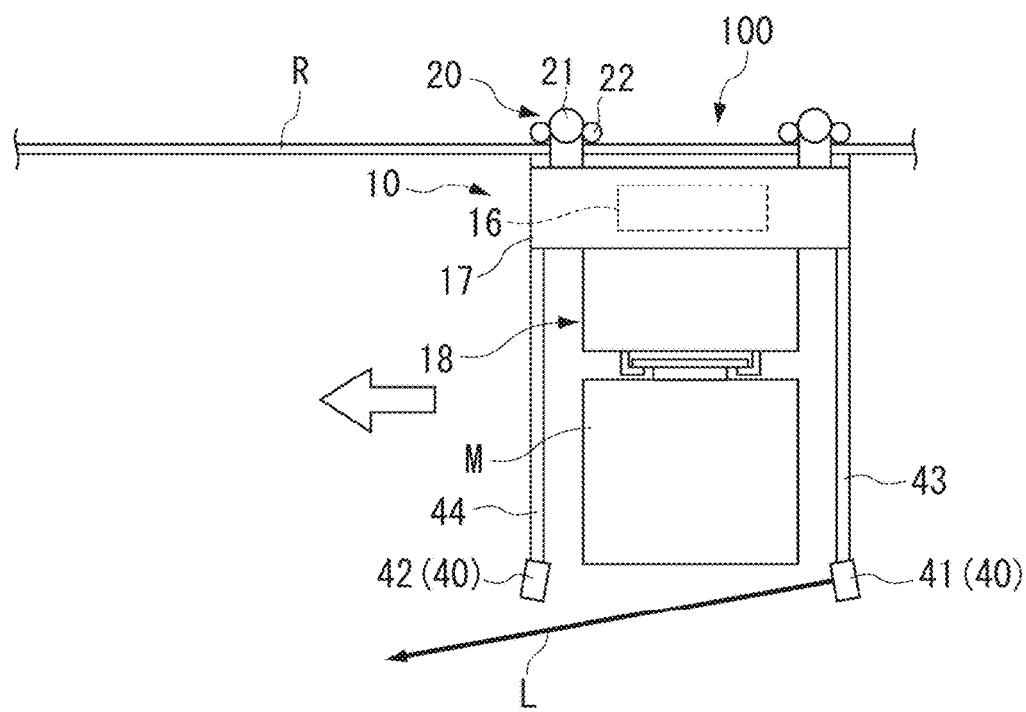

The following describes an operation of the detector 40 in the ceiling traveling vehicle 100. FIGS. 9A and 9B illustrate examples of operations of the first detector 41 and the second detector 42: FIG. 9A is a diagram illustrating a detection operation by the second detector 42; and FIG. 9B is a diagram illustrating a detection operation by the first detector 41. As illustrated in FIG. 9A, in a state in which the ceiling traveling vehicle 100 is traveling along the grid-shaped track R in the arrow direction by the traveler 20, the detection light L is applied from the second detector 42 on the rear side in the traveling direction. When from this state the traveling direction of the traveler 20 is changed to the opposite direction (the arrow direction in FIG. 9B) as illustrated in FIG. 9B, the second detector 42 is switched to the first detector 41 by the switch 16, and the detection light L is applied from the first detector 41. When the traveling direction is changed from the state illustrated in FIG. 9B to the state illustrated in FIG. 9A, the first detector 41 is switched to the second detector 42 by the switch 16.

Thus, the detector 40 applying the detection light L can automatically be switched in accordance with the traveling direction of the traveler 20. In both of the state illustrated in FIG. 9A and the state illustrated in FIG. 9B, the detection light L is applied forward in the traveling direction and downward from the detector 40 on the rear side in the traveling direction, and when there is an obstacle at the front in the traveling direction and below, both the first detector 41 and the second detector 42 receive the reflected light of the detection light L and can thus detect the obstacle. The controller 50, when the obstacle is detected by the detector 40, stops the traveling of the traveler 20 and notifies an operator or the like of the presence of the obstacle.

Figure 10A:
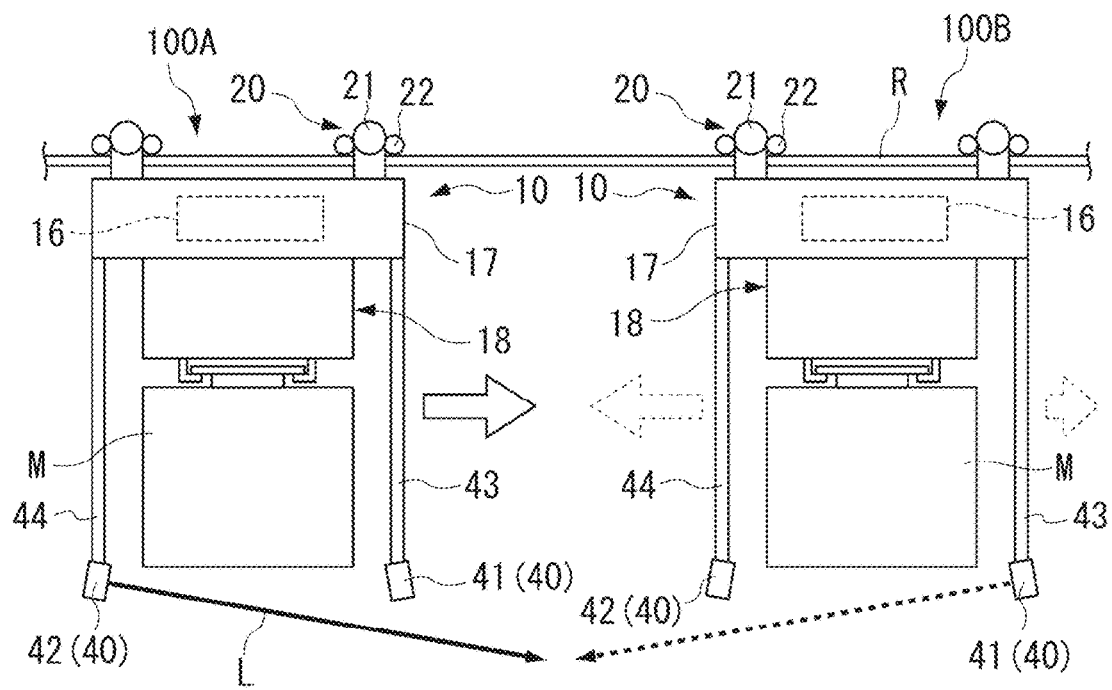
FIGS. 10A and 10B illustrate examples of detection operations in two ceiling traveling vehicles traveling along the same track.
Figure 10B:
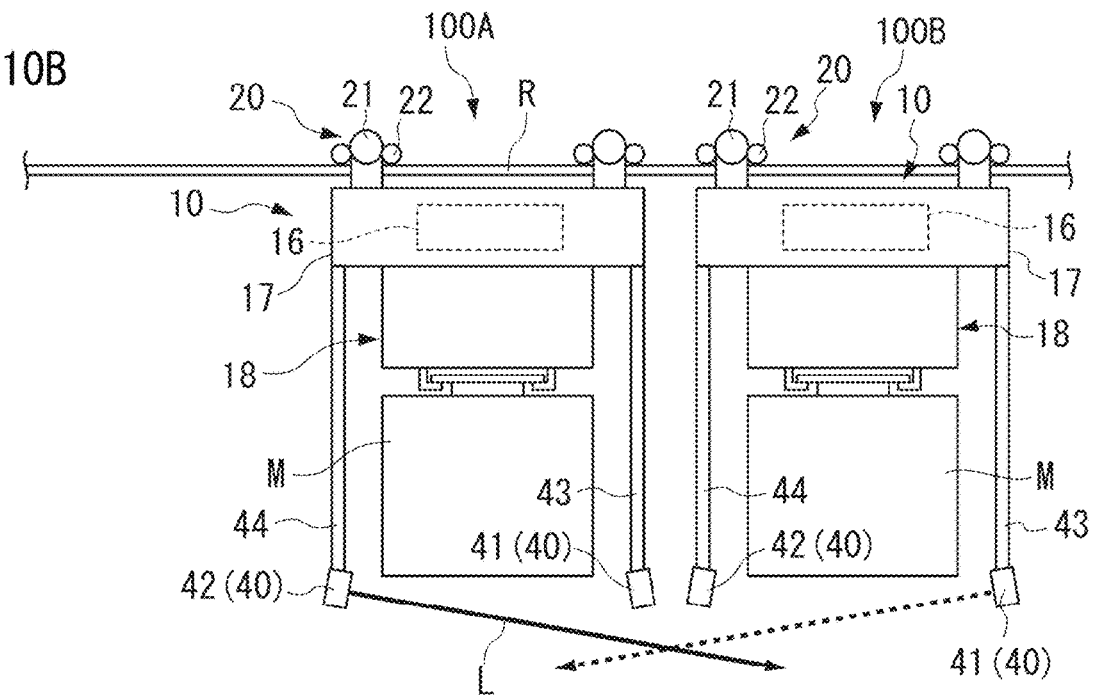

The following describes an operation of the detector 40 in the ceiling traveling vehicle system SYS in which a plurality of ceiling traveling vehicles 100 travel along the grid-shaped track R. FIGS. 10A and 10B illustrate examples of a detection operation in two ceiling traveling vehicles 100A and 100B traveling along the same track (the first track R1 or the second track R2): FIG. 10A is a diagram of a state in which the ceiling traveling vehicles 100A and 100B are separate from each other; and FIG. 10B is a diagram of a state in which the ceiling traveling vehicles 100A and 100B are close to each other. In FIGS. 10A and 10B, a case in which the ceiling traveling vehicle 100A travels in the arrow direction to approach the ceiling traveling vehicle 100B is described as an example. The ceiling traveling vehicle 100B is any of a case of being stationary, a case of traveling in the same direction as that of the ceiling traveling vehicle 100A at a speed slower than that of the ceiling traveling vehicle 100A, and a case of traveling in a direction opposite to the ceiling traveling vehicle 100A. The ceiling traveling vehicles 100A and 100B each have a configuration similar to that of the ceiling traveling vehicle 100 described above.

As illustrated in FIG. 10A, the ceiling traveling vehicle 100A applies the detection light L from the second detector 42 on the rear side in the traveling direction. The detection light L is applied forward in the traveling direction and downward. Consequently, as illustrated in FIG. 10B, when the ceiling traveling vehicle 100A has approached the ceiling traveling vehicle 100B, the detection light L applied from the second detector 42 of the ceiling traveling vehicle 100A passes through below the ceiling traveling vehicle 100B and is not applied to the ceiling traveling vehicle 100B. Consequently, the second detector 42 of the ceiling traveling vehicle 100A can be prevented from falsely detecting the ceiling traveling vehicle 100B as an obstacle.

When the ceiling traveling vehicle 100B is traveling in the direction opposite to the ceiling traveling vehicle 100A, the detection light L applied from the second detector 42 of the ceiling traveling vehicle 100A can be prevented from entering the first detector 41 of the ceiling traveling vehicle 100B, and in addition, the detection light L applied from the first detector 41 of the ceiling traveling vehicle 100B can be prevented from entering the second detector 42 of the ceiling traveling vehicle 100A. Consequently, the ceiling traveling vehicles 100A and 100B, even when traveling along the same track to approach each other, can prevent the other part from being falsely detected as an obstacle.

Operations of the ceiling traveling vehicles 100A and 100B are controlled by a host controller (not illustrated) collectively controlling the ceiling traveling vehicle system SYS. The host controller determines the positions of the ceiling traveling vehicles 100A and 100B and controls their operations such that the ceiling traveling vehicles 100A and 100B do not interfere with each other, and thus the ceiling traveling vehicles 100A and 100B do not come into contact with each other. Thus, detection of other ceiling traveling vehicle 100 as an obstacle by the detector 40 corresponds to false detection.

Figure 11:
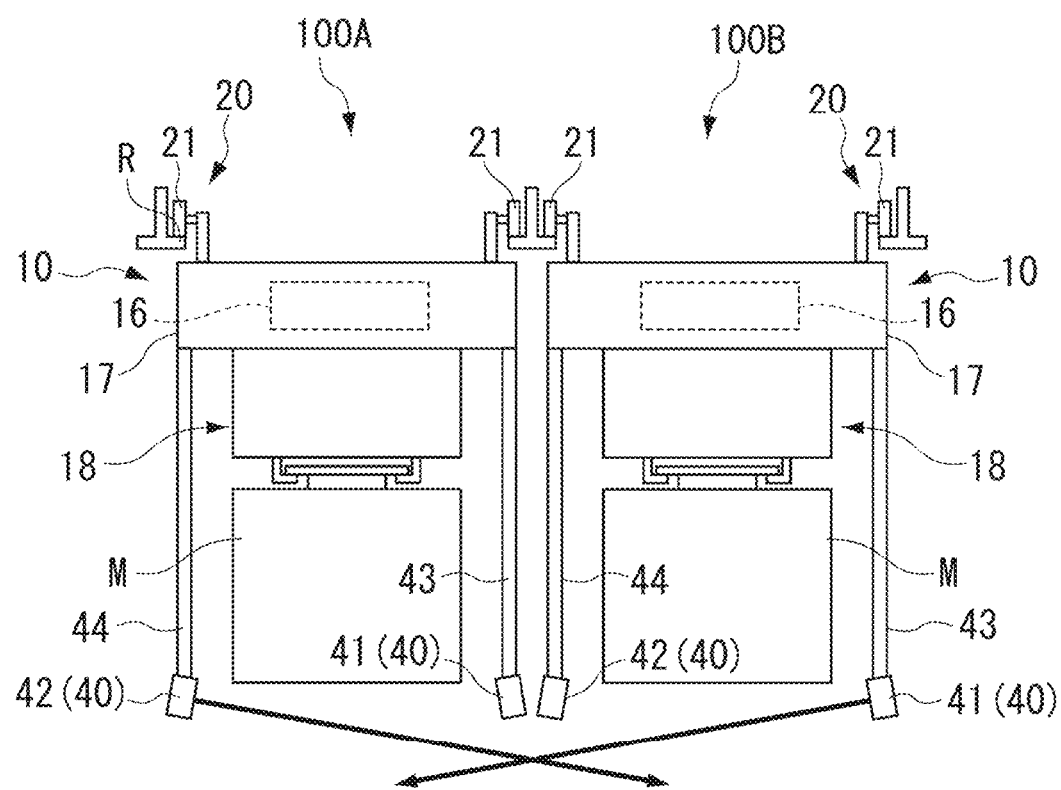
FIG. 11 is a diagram illustrating an example of a detection operation in two ceiling traveling vehicles traveling along different tracks in close to each other.

FIG. 11 is a diagram illustrating an example of a detection operation in the two ceiling traveling vehicles 100A and 100B traveling along different tracks (two first tracks R1 adjacent to each other, for example) close to each other. In FIG. 11, a case in which the two ceiling traveling vehicles 100A and 100B are close to each other on a lateral side of the traveling direction is described, and a case in which the ceiling traveling vehicles 100A and 100B pass each other and a case in which they travel side by side in the same direction are described as examples.

As illustrated in FIG. 11, the ceiling traveling vehicle 100A applies the detection light L from the second detector 42 on the rear side in the traveling direction. The detection light L is scanned from the front side to the lateral side of the traveling direction and is applied in a direction inclined downward with respect to the horizontal direction. The ceiling traveling vehicle 100B traveling in the direction opposite to the ceiling traveling vehicle 100A applies the detection light L from the first detector 41 on the rear side in the traveling direction. The detection light L is scanned from the front side to the lateral side of the traveling direction and is applied in a direction inclined downward with respect to the horizontal direction.

As illustrated in FIG. 11, when the ceiling traveling vehicles 100A and 100B have approached each other on the lateral side of the traveling direction, the detection light L applied from the second detector 42 of the ceiling traveling vehicle 100A may be applied not only to the front in the traveling direction but also toward the ceiling traveling vehicle 100B on the lateral side in a plan view (refer to FIG. 7). In this case, the detection light L is applied downward and thus passes below the ceiling traveling vehicle 100B. Consequently, the first detector 41 or the second detector 42 of the ceiling traveling vehicle 100B does not receive the detection light L from the ceiling traveling vehicle 100A and can prevent the ceiling traveling vehicle 100A from being falsely detected as an obstacle. Also when the detection light L applied from the first detector 41 of the ceiling traveling vehicle 100B is applied toward the ceiling traveling vehicle 100A on the lateral side in a plan view, the detection light L is applied downward and thus passes below the ceiling traveling vehicle 100A. Consequently, the first detector 41 or the second detector 42 of the ceiling traveling vehicle 100A does not receive the detection light L from the ceiling traveling vehicle 100B and can prevent the ceiling traveling vehicle 100B from being falsely detected as an obstacle.

Thus, according to the ceiling traveling vehicles and the methods for detecting an obstacle according to preferred embodiments of the present preferred embodiment described above, the detection light L is applied forward in the traveling direction and downward from the rear side of the center of the main body 10, and thus another ceiling traveling vehicle present in front or on the lateral side can be prevented from being falsely detected as an obstacle, for example, while surely detecting an obstacle as a hindrance to traveling. In the ceiling traveling vehicle system SYS according to the present preferred embodiment, the ceiling traveling vehicle 100 is used such that in a case in which interference between the ceiling traveling vehicles 100 is prevented by means other than the detector 40, each of a plurality of ceiling traveling vehicles 100 prevents another ceiling traveling vehicle 100 from being falsely detected as an obstacle to prevent each ceiling traveling vehicle 100 from unnecessarily stopping, such that the operation efficiency of the system can be improved.

Although the preferred embodiments have been described, the present invention is not limited to the description described above, and various modifications can be made to the extent not departing from the gist of the present invention. Although the preferred embodiments include two detectors, or the first detector 41 and the second detector 42, as the detector 40 as an example, for example, this aspect is not limiting. The number of the detector 40 may be one or three or more. When one detector 40 is used, the main body 10 may include a mover to move the detector 40 along a horizontal plane (the XY plane) and drive the mover such that the detector 40 is positioned on the rear side of the center of the main body 10 in accordance with the traveling direction.

Although the preferred embodiments include a configuration in which the detection light L is scanned in a range of 90 degrees or substantially 90 degrees in a plan view from the front in the traveling direction as an example, this aspect is not limiting. The scanning range of the detection light L may be a range of 90 degrees or less or 90 degrees or more in a plan view from the front in the traveling direction, for example. The first detector 41 or the like may be provided with a window defining the scanning range of the detection light L, and this window may be moved to set the range in which the detection light L is scanned.

Although the preferred embodiments include a configuration in which the first detector 41 or the like scans the detection light L as an example, this configuration is not limiting. The detection light L applied from the detector 40 may be line light, for example. In this case, the entire line light may be applied from the detector 40 forward in the traveling direction and downward. To the extent permitted by law, the contents of Japanese Patent Application No. 2018-203023 as a Japanese patent application and all the literature cited in the present specification are hereby incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A ceiling traveling vehicle system comprising:
a track; and
a plurality of ceiling traveling vehicles to travel along the track; wherein
each of the plurality of ceiling traveling vehicles includes:
a traveler to travel along the track;
a main body coupled to the traveler and below the track; and
a detector on a rear side of a center of the main body in a traveling direction of the traveler and below the main body to apply detection light forward in the traveling direction and downward and detect an obstacle by receiving reflected light of the detection light; wherein
the track is a grid-shaped track including a plurality of first tracks provided along a first direction and a plurality of second tracks provided along a second direction perpendicular or substantially perpendicular to the first direction, the plurality of first tracks and the plurality of second tracks form a plurality of cells continuous and adjacent to each other in the first direction and the second direction;
the plurality of cells continuous and adjacent to each other in the first direction form a plurality of rows of cells that each extends in the first direction;
the plurality of rows of cells are continuous and adjacent to each other in the second direction to form the grid-shaped track;
the ceiling traveling vehicles are each capable of traveling and shifting from one of the first tracks to one of the second tracks or shifting from one of the second tracks to one of the first tracks; and
the detector is capable of switching a detection range of the detector based on the traveling direction of the traveler in the grid-shaped track.

2. The ceiling traveling vehicle system according to claim 1, wherein
the main body includes an upper portion fixed to the traveler and a transfer apparatus below the upper portion to be rotatable about a rotation axis in a vertical direction; and
the detector is mounted on a support in the upper portion so as to be outside a rotational range of the transfer apparatus in a plan view.

3. The ceiling traveling vehicle system according to claim 2, wherein
the detector includes two detectors at respective positions across the transfer apparatus on an imaginary line inclined by 45 degrees or substantially 45 degrees with respect to the traveling direction in a plan view; and
the ceiling traveling vehicle comprises a switch to switch to the detector on the rear side in the traveling direction among the two detectors.

4. The ceiling traveling vehicle system according to claim 3, wherein each of the two detectors scans the detection light in a range of 90 degrees or substantially 90 degrees clockwise or counterclockwise in a plan view from front in the traveling direction.

5. The ceiling traveling vehicle system according to claim 1, wherein
the detector includes two detectors; and
the detection range of one of the two detectors is one range in both directions of the first direction and one range in both directions of the second direction, whereas the detection range of another of the two detectors is another range in both directions of the first direction and another range in both directions of the second direction.

6. The ceiling traveling vehicle system according to claim 1, wherein the detector scans the detection light to apply the detection light to the detection range.

7. The ceiling traveling vehicle system according to claim 1, wherein
when the traveling direction is toward a first side in the first direction or toward a second side in the second direction, the detection range is defined by a straight line extending from the ceiling traveling vehicle toward the first side and the straight line extending from the ceiling traveling vehicle toward the second side in a plan view; and
when the traveling direction is toward a third side in the first direction or toward a fourth side in the second direction, the detection range is defined by a straight line extending from the ceiling traveling vehicle toward the third side and a straight line extending from the ceiling traveling vehicle toward the fourth side in a plan view.

8. A method for detecting an obstacle for a ceiling traveling vehicle system including a track and a plurality of ceiling traveling vehicles to travel along the track, each of the plurality of ceiling traveling vehicles including a traveler to travel along the track, a main body coupled to the traveler and below the track, and a detector on a rear side of a center of the main body in a traveling direction of the traveler and below the main body to apply detection light forward in the traveling direction and downward and detect an obstacle by receiving reflected light of the detection light, the track being a grid-shaped track including a plurality of first tracks provided along a first direction and a plurality of second tracks provided along a second direction perpendicular or substantially perpendicular to the first direction, the plurality of first tracks and the plurality of second tracks forming a plurality of cells are continuous and adjacent to each other in the first direction and the second direction, the plurality of cells continuous and adjacent to each other in the first direction form a plurality of rows of cells that each extends in the first direction, and the plurality of rows of cells are continuous and adjacent to each other in the second direction to form the grid-shaped track, the method comprising:
applying the detection light from the rear side of the center of the main body in the traveling direction of the traveler and below the main body forward in the traveling direction and downward; and
detecting the obstacle by receiving the reflected light of the detection light; wherein
the ceiling traveling vehicles are each capable of traveling and shifting from one of the first tracks to one of the second tracks or shifting from one of the second tracks to one of the first tracks; and
the detector is capable of switching a detection range of the detector based on the traveling direction of the traveler in the grid-shaped track.

9. The method according to claim 8, wherein
when the traveling direction is toward a first side in the first direction or toward a second side in the second direction, the detection range is defined by a straight line extending from the ceiling traveling vehicle toward the first side and the straight line extending from the ceiling traveling vehicle toward the second side in a plan view; and when the traveling direction is toward a third side in the first direction or toward a fourth side in the second direction, the detection range is defined by a straight line extending from the ceiling traveling vehicle toward the third side and a straight line extending from the ceiling traveling vehicle toward the fourth side in a plan view.

* * * * *